United States Patent [19]

Morse

[11] 4,272,692
[45] Jun. 9, 1981

[54] POWER SUPPLY DISTRIBUTION SYSTEM

[75] Inventor: Alfred W. Morse, Baltimore, Md.

[73] Assignee: Westinghouse Electric Corp., Pittsburgh, Pa.

[21] Appl. No.: 14,409

[22] Filed: Feb. 23, 1979

[51] Int. Cl.³ .......................... H03K 17/62; H02J 1/06; H02J 4/00

[52] U.S. Cl. ........................... 307/268; 307/30; 307/34; 307/296 A; 328/67; 328/70; 323/349

[58] Field of Search ............ 307/12, 30, 34, 103, 307/155, 296, 296 A, 297, 268; 328/67, 70, 103, 267; 323/9, 17; 330/297

[56] References Cited

U.S. PATENT DOCUMENTS

| | | | |
|---|---|---|---|
| 3,535,560 | 10/1970 | Cliff | 307/296 A |
| 3,594,592 | 7/1971 | Deniskoet al. | 307/260 |
| 3,716,798 | 2/1973 | O'Loughlin | 328/67 |
| 3,774,054 | 11/1973 | Morse | 307/246 |
| 3,955,106 | 5/1976 | Berry | 307/268 |
| 4,058,742 | 11/1977 | O'Brien | 307/260 |
| 4,070,589 | 1/1978 | Martinkovic | 307/246 |
| 4,181,841 | 1/1980 | Schaible et al. | 307/30 |

Primary Examiner—John Zazworsky
Attorney, Agent, or Firm—H. W. Patterson

[57] ABSTRACT

A plurality of modules, each adapted to generate repetitive RF pulses are connected to a common coarse DC power supply. Each of the modules, which include a pulsed load, has a switching transistor connected in series with the load, and a precise voltage connected to its base to regulate the voltage during each of the individual pulses. A capacitor may be connected in each of the modules for improving the rise time of the individual pulses.

5 Claims, 4 Drawing Figures

4,272,692

POWER SUPPLY DISTRIBUTION SYSTEM

BACKGROUND OF THE INVENTION

The present invention relates to a power supply distribution system; and more particularly to a pulsed voltage supply for a plurality of parallel connected modules of a power amplifier.

Solid-state power amplifiers for radar applications, for example, require a high degree of pulse-to-pulse phase and amplitude stability. The principal limitation on this stability is the quality of the power supply voltage at the RF amplifier transistors that are rendered conductive to constitute a pulsed load of the appropriate frequency. Both the phase and output amplitude of a class B or C power amplifier change with variations in the voltages of these RF transistors. The required RF stability, therefore, is directly dependent upon the stability of the supply voltage; and such required voltage stability for such applications, for example, may be in the several millivolt region for high performance radar systems.

Heretofore, and referring to FIG. 1, a coarse DC voltage supply referred to at 10 may be derived by a rectifier bridge or inverter power supply, for example. A DC precision regulator 11 which is utilized to remove inverter ripple and other voltage perturbations, includes a power supply transistor 12 having its collector and emitter portions connected in series in output line 13 of the power supply 10. The precision regulator 11 conventionally includes a voltage reference source 14 connected to the base portion of the transistor 12 to cause the transistor 12 to conduct to charge a capacitor bank 15 that is connected across the output 13 and an output 16 of the regulator 11 to provide energy storage for each of a plurality of RF amplifier modules 17 and 18. The individual modules are connected in parallel to the outputs 13 and 16 of the precision regulator 11 downstream of the capacitor 15. Each of the modules 17 and 18 may include one or more inductors such as 21 and 22 connected in series with the emitter and collector terminals of RF transistors 23 and 24, respectively. The series connected inductors and their associated RF transistors are connected across suitable conductors 25 and 26 in each respective modules 17 and 18 which are connected to the capacitor to the output leads of the regulator 11. The pulsed output may be obtained on lines 27 and 28 through parallel connected secondary inductive windings 29 and 30. A conventional amplifier 31 having an RF input is connected to the base portions of each of the transistors to drive the transistors at the appropriate frequency. A capacitor 43 which is 1 to 2% the size of the bank 15 may be connected across leads 25 and 26 of its respective module to increase the rise time of the pulses.

To summarize the operation of the prior art arrangement of FIG. 1, reference is made to the wave forms of FIG. 2. A wave form referred to as 32 illustrates the voltage at the output of the DC supply 10 at point A as shown in FIG. 1 which includes the ripple connected with such voltage and the drooping effects at 33 and 34 caused by the regulation of the load in the plurality of modules 17 and 18. A typical voltage wave form 35 occurs at the output of the regulator 11 at point B shows the ripple removed, but a slight droop in such voltage value at 36 and 37 which occurs in charging the capacitor bank 15. A wave form 38 at 39 and 40 illustrates the general nature of the current at points A and B of FIG. 1 in response to the drawing of current by the modules 18 and 17 upstream of the capacitor bank 15. Wave forms 41 and 42 represent the peak current for the duration of each of the pulses downstream of the capacitor bank 15. Each of the plurality of solid-state power modules draw high current pulses out of the common energy storage bank 15 at the RF pulse width and repetition rate to which is supplied a relatively constant current from the regulator 11. For radar applications, the pulse duty cycles may typically range from 1% to 10%. Thus, the peak currents from the capacitor bank 15 may be ten to one hundred times greater than the average current from the precision regulator 11 which recharges it. The capacitor bank 15 is required to store many times the individual pulse energy in order to minimize voltage droop during each pulse, which in turn, produces amplitude and phase droop in each of the RF pulses. In addition, the capacitor bank 15 must be precisely recharged before each pulse in order to maintain identity between successive pulses. The recharging problem may be particularly severe for applications where the pulse repetition rate is staggered. Exponential charging or lead ringing produces different recharge voltages for different interpulse periods.

Therefore, it is desirable to provide a power system for a plurality of parallel connected modules that reduces the energy storage requirements, yet improves the stability of the amplifier, and simplifies the power distribution.

SUMMARY OF THE INVENTION

In accordance with the present invention, a direct current common power supply is connected at its output to a plurality of parallel connected modules that constitute a power amplifier. Each of the modules includes a pulsing regulator transistor having collector, emitter and base portions mounted in each of the modules. The collector portion of each of the transistors is connected electrically to the common power supply; and a pulsing load is mounted in each module that is electrically connected at one side to the emitter portion of its respective pulsing regulator transistor and its other side to the other of the inputs from the common power supply. The pulsing load for each module includes an RF transistor that is driven at the appropriate frequency to provide a pulsed output. A precision voltage source for each of the plurality of modules is connected electrically to the base of its respective pulsing regulator transistor. Such precision voltage causes the pulsing regulator transistor to conduct in response to the conducting of each RF transistor and is of a value to produce a current substantially equal to the pulsing load of its respective module divided by the current gain of its associated pulsing regulator transistor. To increase the rise times of each of the pulses, a small capacitor may be mounted in the module and electrically connected across the DC source upstream of the pulsing regulator transistor.

DESCRIPTION OF THE PREFERRED EMBODIMENT

Figure 1:
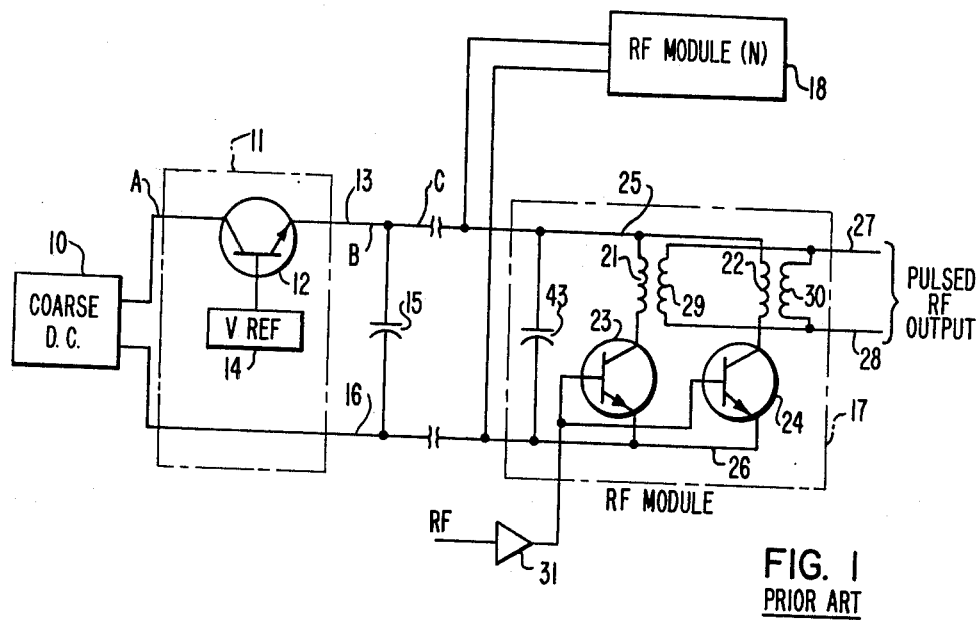
FIG. 1 is a system illustrating the regulation of voltage for a plurality of modules of a class B or C amplifier according to the prior art.
Figure 2:
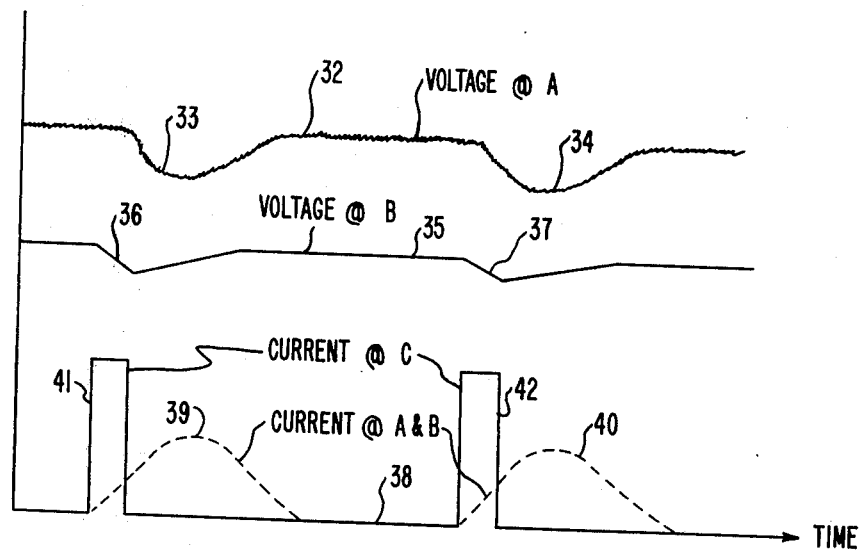
FIG. 2 is a graphical representation of the operation of the prior art system of FIG. 1.
Figure 3:
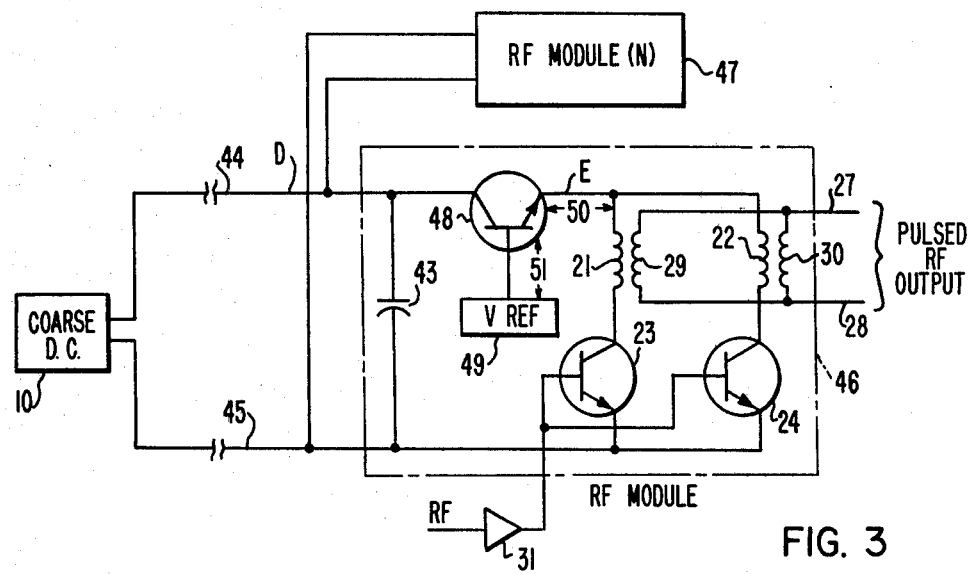
FIG. 3 is a block diagram of a system in accordance with one embodiment of the present invention.
Figure 4:
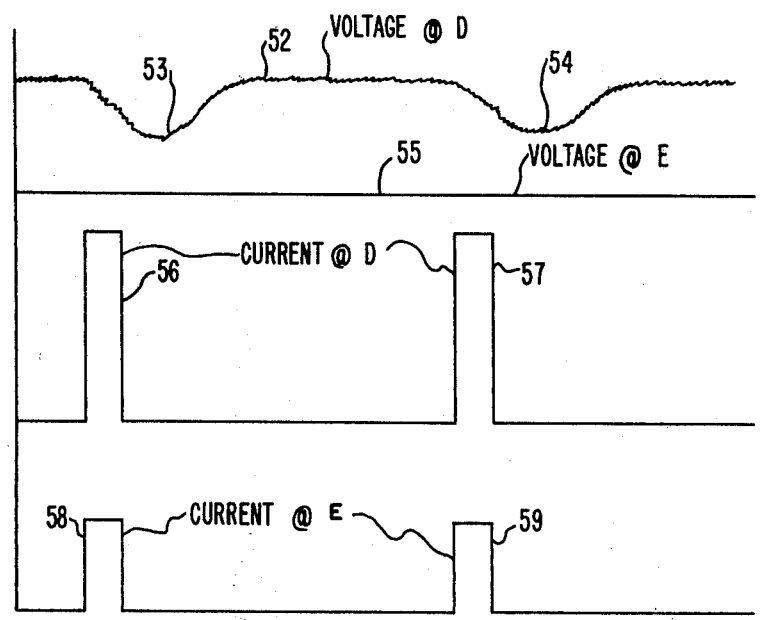
FIG. 4 is a graphical representation of the operation of the system of FIG. 3.

In describing the present invention in connection with FIGS. 3 and 4, those components or portions of FIGS. 3 and 4 which may be similar to those described in connection with the prior art system of FIGS. 1 and 2 are given the same reference characters. The coarse DC supply source 10 is connected at its outputs 44 and 45 to parallel-connected modules 46 and 47 of a class B or C power amplifier. The DC supply 10 is preferably a coarse regulated DC supply which means that it is to a certain extent imprecise and may be only regulated against line voltage, but not regulated for load change. Such a supply may have an alternating current regulator which feeds into a rectifier bridge to generate a DC voltage which does not change with line voltage. Also, it could be an inverter which is capable of regulating the voltage to a percent or so, but with ripple effect; or it may be a generator which is regulated to ±5% of the desired voltage value, for example. It may, of course, be completely unregulated for certain applications.

The term module when used in this specification is meant to include any physical structure or enclosure on which the component parts are mounted thereon, integrated, or enclosed therein manufactured in a conventional manner. Such module may be a cabinet, a printed circuit board, or an integrated circuit for example. Although the circuitry is shown for the module 46, it is understood that similar circuitry is included in the module 47 or any other additional modules which may be connected in parallel in the system.

Each of the modules 46 and 47 includes a transistor 48 having its collector portion connected directly to the line 44 from the DC supply source 10, and its emitter portion connected to one side of the pulsed load, which load includes the inductance 21 and 22 and its associated series connected RF transistor 23 and 24. The other side of the pulsed load is connected directly to the line 45 which may be at ground potential. The transistor 48 has a base portion which is connected to a voltage reference referred to at 49.

The pulsing regulator transistor 48 is a switching transistor that has the capability of changing conductance at a rapid rate. The switching transistor is operated in an unsaturated, linear regulator mode and has far greater bandwidth than a conventional power supply regulating transistor. For example, the chip from a transistor of the type designated as 2N6032 may be bonded in the module 46 and 47, and is capable of over 40 amperes of peak current with rise times of a few hundred nanoseconds. Since the transistor 48 operates at a low-duty cycle, under normal application, a powerful device such as the type mentioned may be used with minimal heat sinking, consistent with inclusion in compact, microelectronic modules. In order to minimize the inductance in the circuit which would adversely affect optimum operation, the length of the line between the emitter portion of the transistor 48 and the pulsed load 21 and 22, which line is represented as the distance shown by arrow 50, should be kept as short as feasible, preferably less than 2 inches. Similarly, the distance of the line between the output stage of the voltage reference 49 and the base of the transistor 48 as represented by arrow 51 should be kept less that 2 inches. With respect to certain implementations of the system of the present invention, it may be preferable to directly bond the emitter portion of the transistor 48 directly to one side of the inductor 21 and the base portion of the transistor 48 directly to the output stage of the voltage reference 49. As in the prior art the RF transistors 23 and 24 are driven at the proper frequency through a conventional driven circuit that includes the amplifier 31. Such driven circuit may be mounted on or in the module as desired.

The voltage reference 49 is a precision voltage source having a current capability that is the pulse load divided by the current gain of the pulsed regulator transistor 48. The voltage reference 49 may be, for example, either a three-terminal integrated circuit regulator or a reference diode and buffer amplifier. Also, such voltage reference 49 should have a low source impedance to the component frequencies for its particular application. In contrast to the precise voltage entering each of the modules 17 and 18 in the prior art as shown by the wave form 35 of FIG. 2, the voltage wave form that enters each of the modules 46 and 47 may have the ripple effect as shown by wave form 52 of FIG. 4, which occurs at point D of FIG. 3. This wave form 52 is similar to the wave form 32 of FIG. 2. Thus, the input to the parallel-connected modules 46 and 47 is not an average current as is required by the precision regulator 11 and the large capacitor storage bank 15 of FIG. 1, but is a coarse voltage supply that is slightly above the desired voltage for each of the individual modules 46 and 47. For example, if it is desired to operate the individual modules 46 and 47 at 40 volts, then the output on the lines 44 and 45 at point D typically may be 46 volts, for example. In accordance with the present invention, it is not necessary to provide the large energy storage of the capacitor bank 15 because the requirement that the line voltage on output 44 and 45 has a precise average current and voltage, is eliminated.

Each transistor 48, in accordance with the present invention, operates in the pulse mode; that is, the peak current is determined by the load rather than the average current, as is the case in the prior art. As seen from the prior art in FIG. 2, a slight droop occurs in the vicinity of 36, 37 at point B at the output of the precision regulator 11 during the occurrence of a pulse and the recharge time of the capacitor bank 15. The current as shown by portions 39 and 40 of the line 38, is an average current that is drawn from the capacitor bank 15. Also, the pulsing current represented by waveforms 41 and 42 of the prior art of FIG. 2 is of a substantial magnitude which is drawn from the plurality of modules such as 17 and 18. In contrast, at the input to each module in the present invention, the voltage from the supply 10 may have a ripple effect and droop in the vicinity of 48 and 49 when the modules 46 and 47 are drawing current as seen from portions 53 and 54 of waveform 52 of FIG. 4. However, the voltage at the emitter portion of the transistor 48, which is represented by waveform 55 of FIG. 4, remains substantially constant irrespective of the operation of the RF transistors 23 and 24. The capacitor 43 which is situated within the module and connected across the leads 44 and 45 adjacent the collector portion of the transistor 48 may be eliminated in the event that a fast pulse rise time is not desired. In response to operation of the pulsed load, the transistor 48 conducts a proportionate share of the peak pulsed current and regulates the voltage applied to the pulsed load which includes inductors 21, 22 in series with the RF transistors 23 and 24, respectively. In this manner, inverter ripple is removed during each current pulse and the RF transistors 23 and 24 are buffered from droop. Referring to waveforms 56 and 57 of FIG. 4, in response to the conduction of the transistors 23 and 24, a current pulse of substantial magnitude is attained at the input to the modules 46, 47 or, in other words, at the output of the coarse DC voltage supply 10. The current at the emitter portion of the transistor 48 in response to the conduction of RF transistors 23 and 24 develops a current of lesser magnitude in each of the modules 46 and 47 as represented by waveforms 58 and 59.

Thus, there has been described a pulsed voltage regulator internal to each of a plurality of modules of a power amplifier which allows a non-precision voltage to be distributed to each such module. A modest amount of energy storage capacity is utilized by the transistor 48 and is allowed to droop several volts during a transmit pulse as described in connection with the waveform 52. The series-connected transistor 48 passes the peak pulse current and regulates the voltage applied to the transistors 23, 24. In this manner, as previously mentioned, any ripple on the DC voltage from the supply 10 is removed during each current pulse. Further, it is seen that the supply voltage is directly regulated during the peak current pulse instead of such voltage being regulated on a large capacitor bank external to each of the parallel-connected modules. Also, the pulsed regulator comprised of the transistor 48 and the voltage reference 49 in each module is constructed such that the lead inductances are minimized and fast pulse rise and fall times are practical. The power supply pulsed regulating transistor 48 as previously described is utilized in the same mode as the RF transistors 23 and 24; that is, a high-peak power need be sustained for only a short pulse. This, of course, is in contrast to the prior art system where the power supply transistor 12 provides a precise average voltage. Since the voltage regulation occurs inside the amplifier module such as 46 and 47, there is no chance of noise pickup between the regulator and any of the RF transistors. Also, the power supply distribution system is simplified since non-precision direct current is carried over the long wires 44 and 45 and does not need to be protected against pickup or a lead ringing. The size, weight and cost of the energy storage capacitor bank 15 is greatly reduced since the voltage droop is regulated out by the pulsed regulating transistor, 48. Further, the power supply regulation function is de-centralized in each of the plurality of modules and the power supply gracefully degrades similar to its respective module.

Although only two modules are shown, with each module having two pulsed loads, it is understood that in actual practice more pulsed loads and modules may be used. Also, a specific class B or C power amplifier has been shown; however, it is understood that the arrangement and types of conventional components may differ in actual practice.

What I claim is:

1. A distributed pulsed power supply, comprising
   a direct current power supply,
   a plurality of modules, each having a pair of inputs electrically connecting each said module in parallel to said power supply,
   a switching transistor having collector, emitter and base portions mounted within each of said modules, said collector portion being connected electrically to one of said inputs,
   a pulsed load mounted in each said module electrically connected at one side to the emitter portion of its respective switching transistor and at its other side to the other of the pair of inputs, said pulsed load including means to repetitively open and close a circuit path from the power supply through the collector and emitter portion of its switching transistor,
   a precision voltage source for each module connected electrically to the base portion of its respective switching transistor, said precision voltage being a value to produce a current substantially equal to the load requirements of its module divided by the current gain of the switching transistor, said switching transistor being operative in a linear regulator mode.

2. A power supply according to claim 1 further including a capacitor mounted in the module electrically connected to the collector portion of the switching transistor at its one side and to the other of the pair of inputs at its other side.

3. A power supply according to claim 1 or 2, wherein the distance between the emitter portion and the load means is less than approximately two inches.

4. A power supply according to claim 1, 2 or 3 wherein the precision voltage source has an output stage and the distance between the base portion and the precision voltage source is less than approximately two inches.

5. A power supply according to claim 1, wherein said pulsed load includes at least an inductor and an RF transistor connected in series, with said series connection being electrically connected across the emitter portion of the switching transistor and the DC power supply.

* * * * *